(12) United States Patent
Lin (10) Patent No.: US 7,053,613 B2
(45) Date of Patent: May 30, 2006

(54) METHOD FOR PARALLEL IMAGE RECONSTRUCTION USING AUTOMATIC REGULARIZATION

(76) Inventor: Fa-Hsuan Lin, 1F., No. 11, alley 170, Sec. 1, Sinsheng S. Rd., Da-an District, Taipei City (TW)

( * ) Notice: Subject to any disclaimer, the term of this patent is extended or adjusted under 35 U.S.C. 154(b) by 12 days.

(21) Appl. No.: 10/859,348

(22) Filed: Jun. 3, 2004

(65) Prior Publication Data

US 2005/0270024 A1 Dec. 8, 2005

(51) Int. Cl.
*G01V 3/00* (2006.01)

(52) U.S. Cl. .................................. 324/307; 324/309

(58) Field of Classification Search ............ 324/307, 324/309; 455/567, 333, 194.2, 225, 233.1, 455/234.2, 550.1; 379/429; 381/334, 389
See application file for complete search history.

(56) References Cited

U.S. PATENT DOCUMENTS

| 6,518,760 B1 * | 2/2003 | Fuderer et al. ............. 324/307 |
| 6,593,741 B1 * | 7/2003 | Bydder et al. ............. 324/307 |
| 6,717,406 B1 * | 4/2004 | Sodickson ................. 324/307 |

OTHER PUBLICATIONS

Lin F-H, Kwong KK, Belliveau JW, Wald LL. "Parallel Imaging Reconstruction Using Automatic Regularization", Magn Reson Med 2004; 51:559-567.*
Hoge WS, Brooks DH, Madore B, Kyriakos W. "On the Regularization of SENSE and Space-RIP in Parallel MR Imaging". IEEE Symposium on Biomedical Imaging (ISBI 2004). Apr. 15-18, 2004.*
King KF, Angelos L. "SENSE Image Quality Improvement Using Matrix Regularization". Proc Intl Soc Mag Reson Med 9 Glasgow, Scotland, 2001; p. 1771.*
Sodickson DK. "Tailored SMASH Image Reconstructions for Robust in vivo Parallel MR Imaging". Magn Reson Med 2000; 44:243-251.*
Hansen C, "Analysis of discrete ill-posed problems by means of the L-curve", SIAM Review, vol. 34, No. 4, pp. 561-580, Dec. 1992.*
Kellman P, McVeigh ER, "SENSE coefficient calculation using adaptive regularization", ISMRM Workshop on Minimum MR Data Acquisition Methods, Marco Island, FL USA, Oct. 20-21, 2001.*

* cited by examiner

*Primary Examiner*—Michael Tokar
*Assistant Examiner*—Jeremiah Shipman
(74) *Attorney, Agent, or Firm*—Bacon & Thomas, PLLC (57) ABSTRACT

The invention relates to a method of parallel imaging reconstruction in parallel magnetic resonance imaging reconstruction. Magnetic resonance data is acquired in parallel by an array of separate RF receiver coils. A reconstruction method based on Tikhonov regularization is presented to reduce the SNR loss due to geometric correlations in the spatial information from the array coil elements. In order to reduce the noise amplification of the reconstruction so-called "g-factor", reference scans are utilized as a priori information of the final reconstructed image to provide regularized estimates for the reconstruction using the L-curve technique. According to the invention the method with the proposed L-curve approach was fully automatic and showed a significant reduction in average g-factors in the experimental images.

14 Claims, 9 Drawing Sheets

METHOD FOR PARALLEL IMAGE RECONSTRUCTION USING AUTOMATIC REGULARIZATION

FIELD OF THE INVENTION

The invention relates to a method for magnetic resonance imaging (MRI) and, in particular, to a method for parallel imaging reconstruction for reducing the noise amplification in the image reconstruction.

BACKGROUND OF THE INVENTION

In dynamic MRI applications, such as functional imaging, interventional imaging and cardiac imaging, there has long been a need in the art for methods and apparatus that provide high quality (e.g., high-resolution and signal-to-noise ratio) images. Increased spatio-temporal resolution in MRI can be achieved using parallel acquisition strategies, which simultaneously sample reduced k-space data using the information from multiple receivers to reconstruct full Field-Of-View (FOV) images. The folded image that would result from a conventional reconstruction is avoided by using spatial information from multiple coils. Some of these conventional methods, such the SMASH method, are described in the Background section of U.S. Pat. No. 6,680,610 by Kyriakos et al. for "Apparatus and method for parallel MR data acquisition and parallel image reconstruction from multiple receiver coil arrays for fast MRI", the disclosure of which is hereby incorporated by reference herein.

The reconstruction of parallel MRI can be formulated as linear equations in the literature of Sodickson et al ("A generalized approach to parallel magnetic resonance imaging" Med Phys 2001; 28: 1629–43.), which must include a matrix inversion process to obtain an unfolded image from the reduced k-space data set. If the matrix is well conditioned, the inversion can be achieved with a minimal amplification of noise. While the encoding matrix can still be inverted even if it is nearly singular, in this ill-conditioned case, small noise perturbations in the measured data (aliased image) can produce large variations in the full FOV reconstruction. This effect causes noise amplifications in regions of the image where the encoding matrix is ill conditioned.

The restoration of full-FOV images requires the use of additional information such as the coil sensitivity maps provided by a low spatial resolution full FOV reference scan. In addition to being required to determine the coil sensitivity profile that becomes part of the linear equations to be inverted, the reference scan might also provide a-priori information useful for regularizing the inversion process. The benefits of incorporating prior information to reduce the noise level of reconstructed images were reported in the literature (King, K. *SENSE image quality improvement using matrix regularization* In: Proceedings of the 9th Annual Meeting of ISMRM, Glasgow, Scotland, 2001. 1771; Tsao, J., Pruessmann, K. Boesiger, P. *Prior-information-enhanced dynamic imaging using single or multiple coils with k-t BLAST and k-t SENSE* In: International Society for Magnetic Resonance in Medicine Tenth Scientific Meeting and Exhibition, Honolulu, Hi., USA, 2002. 2369; Lin, F.-H., Kwong, K. K., Chen, Y.-J., Belliveau, J. W. Wald, L. L. *Reconstruction of sensitivity encoded images using regularization and discrete time wavelet transform estimates of the coil maps* In: International Society for Magnetic Resonance in Medicine Tenth Scientific Meeting and Exhibition, Honolulu, Hi., USA, 2002. 2389). Nevertheless, no systematic approach has been described to estimate a regularization parameter for SENSE image reconstruction. And spatial distribution of noise arising from unfolding SENSE images has not been well characterized when regularization is employed.

SUMMARY OF THE INVENTION

An object of the present invention is to provide a method for parallel imaging reconstruction in parallel MRI reconstruction to reduce the noise amplification of the reconstruction.

Another object of the present invention is to provide a framework to mitigate the noise amplification effect in SENSE reconstruction by utilizing Tikhonov regularization.

In a preferred embodiment of the present invention, the method for parallel imaging reconstruction in parallel MRI reconstruction comprises: acquiring full FOV images from multiple RF receivers to calculate noise covariances among multiple RF receivers and to calculate coil sensitivity for multiple RF receivers; acquiring sub-FOV images from multiple RF receivers; unfolding images for individual RF receivers given the noise covariances among RF receivers and coil sensitivity of individual RF receivers; and combining unfolded images from individual RF receivers to generate a FOV reconstructed magnetic resonance images; characterized in that said method further comprises: calculating full FOV reference images as prior information of the reconstruction image; estimating a given regularization parameter in the image reconstruction within a predetermined extent from the prior information; and obtaining the reconstructed magnetic resonance images using Tikhonov regularization with the optimal regularization parameter.

BRIEF DESCRIPTION OF THE DRAWINGS

The following detailed description of some preferred embodiments of the present invention will be better understood when read in conjunction with the appended drawings. For the purpose of illustrating the present invention, there is shown in the drawings embodiments, which are presently preferred. However, the present invention is not limited to the precise arrangements and instrumentalities shown in the drawings.

DETAILED DESCRIPTION OF PREFERRED EMBODIMENT

Theory

Figure 1:
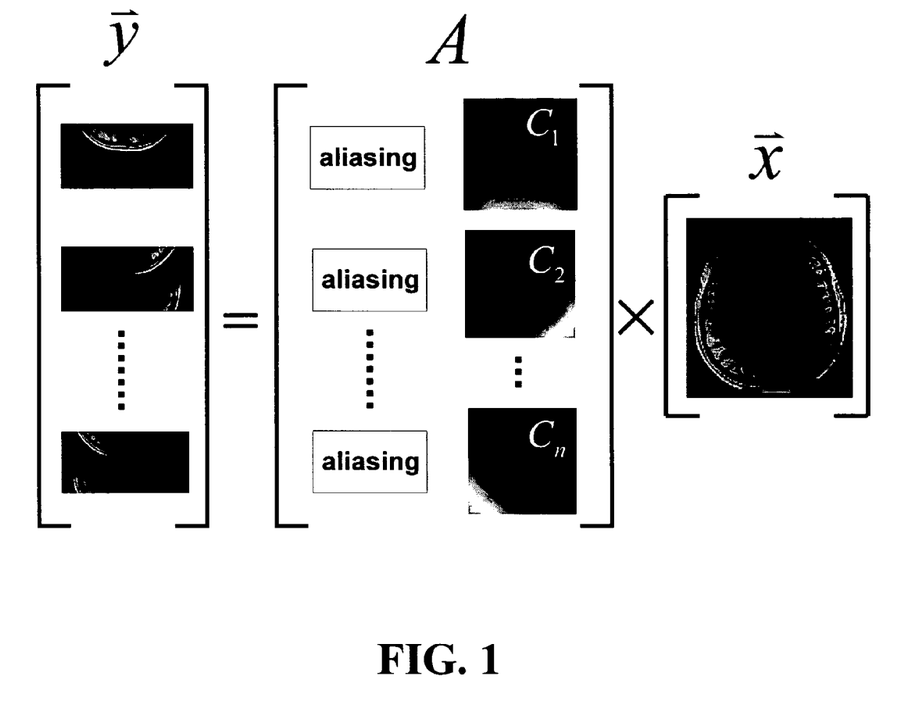
FIG. 1 is a schematic diagram illustrating a linear operation to "fold" the full-FOV spin density images of a brain.

The formation of aliased images from multiple receivers in parallel MRI can be formulated as a linear operation to "fold" the full-FOV spin density images.

$$\vec{y}^\omega = A \vec{x}^\omega \quad [1]$$

Where $\vec{y}^\omega$ is the vector formed from the pixel intensities recorded by each receiver, i.e. folded image and $\vec{x}^\omega$ is the vector formed from the full FOV image, the encoding matrix A consists of the product of the aliasing operation due to sub-sampling of the k-space data and coil-specific sensitivity modulation over the image. The goal of the image reconstruction is to solve for $\vec{x}^\omega$ given our knowledge of A derived from our understanding the aliasing operation and an estimate of the coil sensitivity maps, $C_n$. FIG. 1 shows a schematic illustration of Eq. [1].

While Eq. [1] is expressed in the image domain SENSE approach proposed by Pruessmann et al. ("*SENSE: sensitivity encoding for fast MRI*" Magnetic Resonance in Medicine, 1999; 42: 952–62), similar linear relationships are formed in the k-space based SMASH method. Furthermore, the same basic formalism is used in either the in-vivo sensitivity method, or conventional SENSE/SMASH methods requiring a coil sensitivity estimation. In general, Eq. [1] is an over-determined linear system, i.e., the number of array coils, which is the row dimension of $\vec{y}^\omega$, exceeds the number of the pixels which fold into the measured pixel; the row dimension of $\vec{x}^\omega$.

To solve for $\vec{x}^\omega$ (the full FOV image) the over-determined matrix is inverted utilizing a least-square estimation.

$$x^\omega = W y^\rho \quad [2]$$
$$= (A^H \Psi^{-1} A)^{-1} A^H \Psi^{-1} y^\rho$$

Where the H superscript denotes the transposed complex conjugate and $\Psi$ is the receiver noise covariance, when $\Psi$ is positive semi-definite, the eigen decomposition $\Lambda$ of the receiver noise covariance leads to the unfolding matrix, W, using the whitened aliasing operator $\tilde{A}$ and the whitened observation $\tilde{y}$.

$$\Psi = V \Lambda V^H \quad [3]$$
$$\tilde{A} \equiv \Lambda^{-1/2} V^H A$$
$$\tilde{y} \equiv \Lambda^{-1/2} V^H y^\varpi$$
$$x^\varpi = W \tilde{y}$$
$$= (\tilde{A}^H \tilde{A})^{-1} \tilde{A}^H \tilde{y}$$

The whitening of the aliasing operator will be used in the regularization formulation introduced in the next section. The whitening incorporates the receiver noise covariance matrix implicitly allowing optimal SNR reconstruction within the regularization formulation. The noise sensitivity of the parallel imaging reconstruction is thus quantified by the amplification of the noise power due to the geometry of the array. This g-factor is thus written $$g_{\rho\rho} = \frac{\sqrt{X_{\rho\rho}^{parallel\ imaging}}}{\sqrt{R}\sqrt{X_{\rho\rho}^{full}}} = \sqrt{\left[(\tilde{A}^H \tilde{A})^{-1}\right]_{\rho\rho} (\tilde{A}^H \tilde{A})_{\rho\rho}} \quad [4]$$

The subscript $\rho$ indicates the voxels to be "unfolded" in the full FOV image, and X denotes the covariance of the reconstruction image vector $\vec{x}^\omega$. Here R denotes the factor by which the number of samples is reduced (the acceleration rate).

Figure 2:
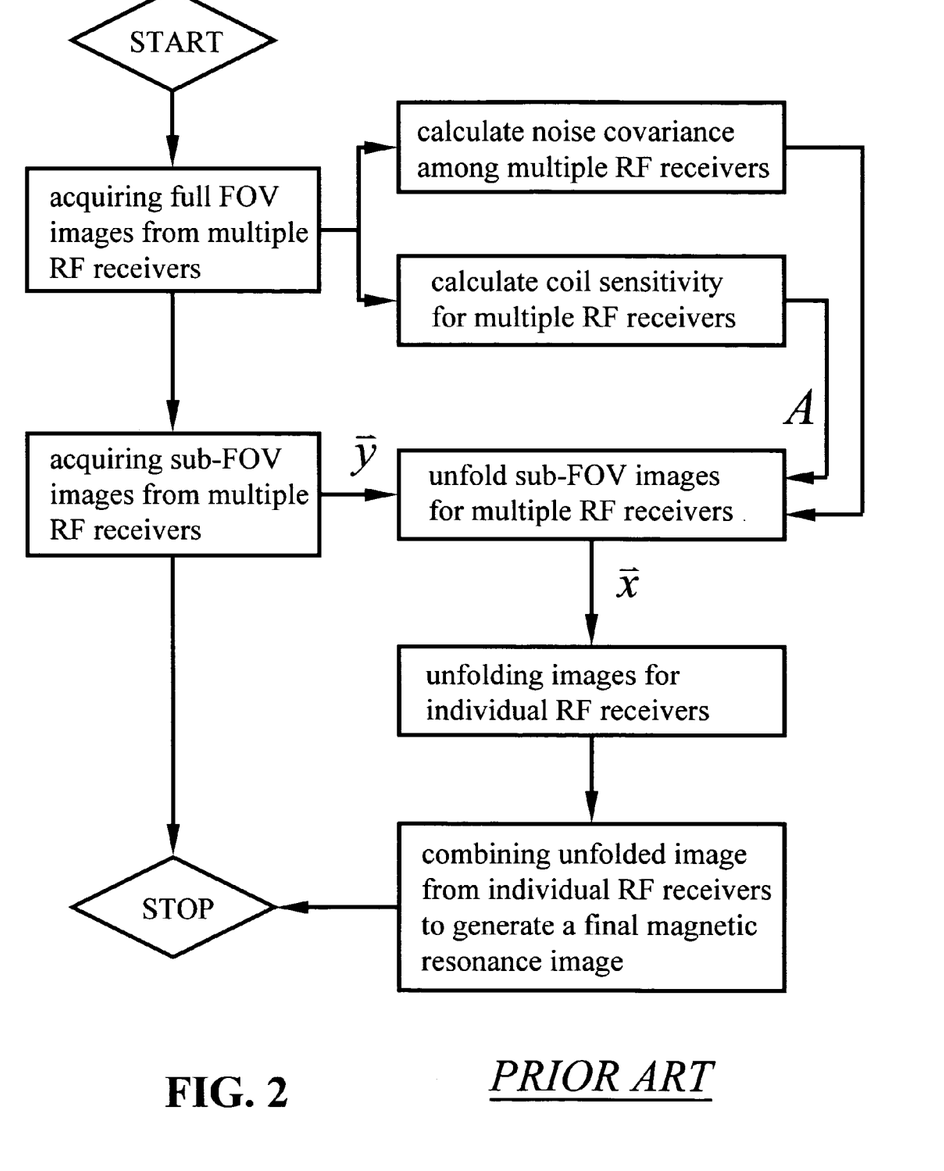
FIG. 2 is a flow chart depicting the steps of the conventional method in a parallel MRI reconstruction.

According to the theory of image reconstruction, FIG. 2 shows a flow chart depicting the steps of the conventional method in a parallel MRI reconstruction. The conventional method comprises: acquiring full FOV images from multiple RF receivers to calculate noise covariance among multiple RF receivers and to calculate coil sensitivity for multiple RF receivers; acquiring sub-FOV images from multiple RF receivers; unfolding images for individual RF receivers given the noise covariance among RF receivers and coil sensitivity of individual RF receivers; and combining unfolded images from individual RF receivers to generate a final magnetic resonance image, wherein the reconstruction image is obtained by solving Eq. [1], which is an over-determined linear system.

Figure 3:
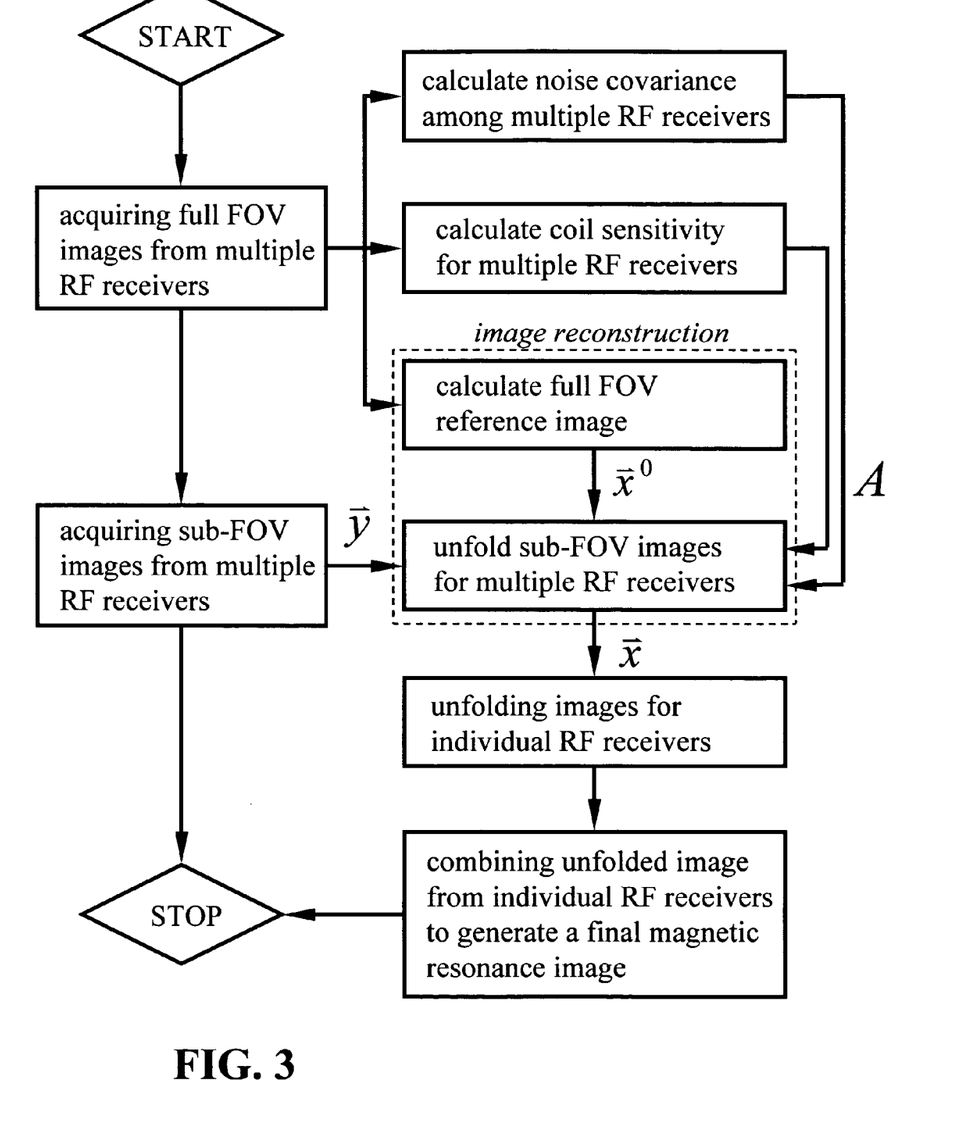
FIG. 3 is a flow chart depicting the steps of the present method according to the present invention.

FIG. 3 is a flow chart depicting the steps of the present method according to the present invention. The method in accordance with the invention is characterized in that for the image reconstruction the method further comprises:

acquiring full FOV images from multiple RF receivers to calculate full FOV reference images as prior information of the reconstruction image;

estimating a given regularization parameter for constraining a solution image within a predetermined extent from the prior information in the Tikhonov regularization framework; particullay, the L-curve approach is applied to estimate the optimal regularization parameter; and obtaining the reconstruction image using Tikhonov regularization with the optimal regularization parameter.

Tikhonov Regularization

Figure 4:
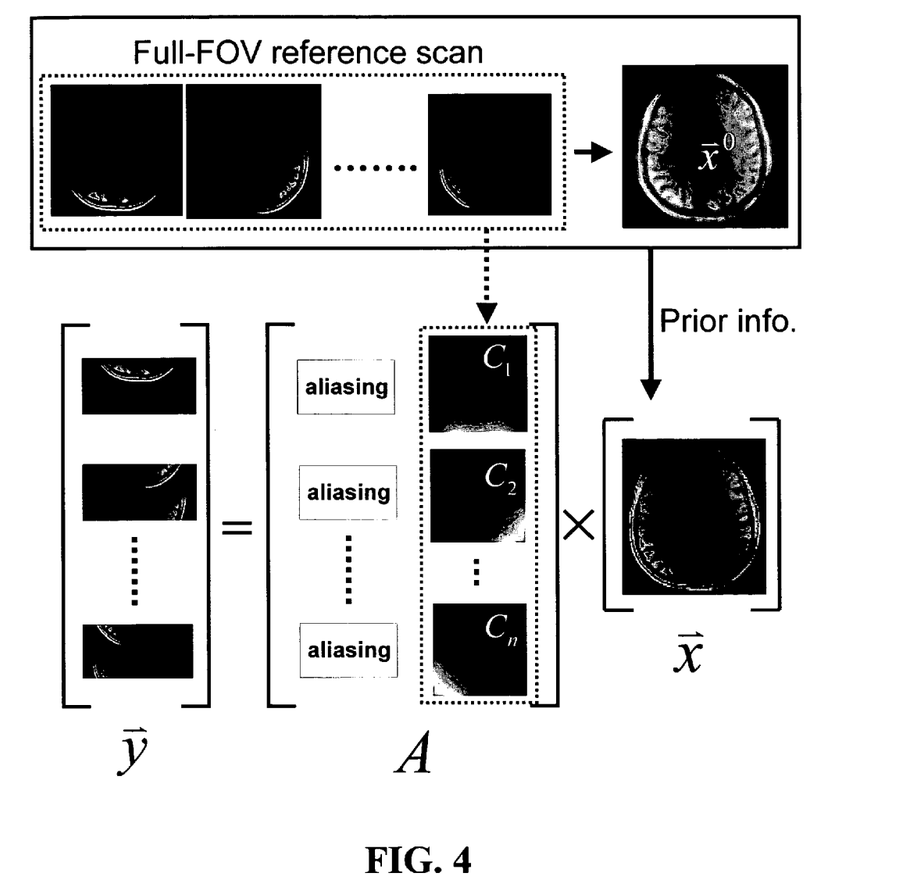
FIG. 4 is a schematic illustration of regularized reconstruction according to the present invention.

Tikhonov regularization (Tikhonov, A. N. Arsenin, V. I. (1977) *Solutions of ill-posed problems*, Publisher, Washington, N.Y.) provides a framework to stabilize the solution of ill-conditioned linear equations. The solution of Eq. [1] using Tikhonov regularization can be written as $$x^{\varpi\lambda} = \arg\min_{x^\varpi}\{\|\tilde{A}x^\varpi - \tilde{y}\|_2 + \lambda^2 \|L(x^\varpi - x^{\varpi 0})\|_2\} \quad [5]$$

Where $\lambda^2$ is the regularization parameter, and L is a positive semi-definite linear transformation, and $\vec{x}^\omega_0$ denotes the prior information of the solution $\vec{x}^\omega$, and $\|\cdot\|_2$ represents the L-2 norm. Thus the second term in Eq. [5], defined as the prior error, is the deviation of the solution image from the prior information. The first term, defined as the model error, represents the deviation of the observed aliased image from the model observation. The model observation is a folded version solution image. The regularization parameter determines the relative weights with which these two estimates of error combine to form a cost function. FIG. 4 shows a schematic illustration of regularized reconstruction according to Eq. [5].

Consider the extreme case when $\lambda^2$ is zero and the first term is minimized. This is equivalent to solving the original equation, $\vec{y} = A\vec{x}$, without conditioning (conventional SENSE reconstruction). At the other extreme, when $\lambda^2$ is large, the solution will be a copy of the prior information $\vec{x}$. Thus, the regularization parameter $\lambda^2$ quantifies the trade-off between the error from the prior information not describing the current image and the error from the noise amplification from the unconditioned matrix inversion. An appropriate choice of $\lambda^2$ (regularization) decreases the otherwise complete dependency on the whitened model ($\tilde{A}$) and the whitened observation ($\tilde{y}$) to constrain the solution to within a reasonable "distance" from the prior information ($\vec{x}$). Thus the regularization increases the influence of the prior information full-FOV image information during the unfolding of the aliased images.

Given the regularization parameter $\lambda^2$ and letting L be an identity matrix, the solution of Eq. [4] is written (Hansen, P. C. (1998) *Rank-deficient and discrete ill-posed problems: numerical aspects of linear inversion*, Publisher, Philadelphia):

$$x^{\varpi\lambda} = \sum_{j=1}^{n}\left(f_j\frac{u_j^{\varpi H}\tilde{y}}{s_{jj}} + (1-f_j)v_j^{\varpi H}x^{\varpi 0}\right)v_j^{\varpi} \quad [6]$$

$$f_j = \frac{s_{jj}^2}{s_{jj}^2 + \lambda^2} \cong \begin{cases} 1, & s_{jj} \gg \lambda \\ s_{jj}^2/\lambda^2, & s_{jj} \ll \lambda \end{cases}$$

Where $\vec{u}_j$, $\vec{v}_j$, and $s_{jj}$ are the left singular vectors, right singular vectors and singular values of $\tilde{A}$ generated by singular value decomposition (SVD) with singular values and singular vectors indexed by j. This leads to the following matrix presentations:

$$x^{\varpi\lambda} = V\Gamma U^H \tilde{y} + V\Phi V^H x^{\varpi 0} \quad [7]$$

$$\text{VAR}(x^{\varpi\lambda}) = V\Gamma^2 V^H$$

$$\Gamma_{ii} = \frac{f_i}{s_{ii}} = \frac{s_{ii}}{s_{ii}^2 + \lambda^2}$$

$$\Phi_{ii} = 1 - f_i = \frac{\lambda^2}{s_{ii}^2 + \lambda^2}.$$

Using regularization and Eq. [4], the ratio of the noise levels between the regularized parallel MRI reconstruction and the original full-FOV image normalized by the factor of acceleration gives the local geometry factor for noise amplification:

$$g_{\rho\rho} = \sqrt{[(V\Gamma^2 V^H)]_{\rho\rho}[(VS^2V^H)]_{\rho\rho}} \quad [8]$$

Inside the square root of Eq. [8], the first square bracket term denotes the variance of the unfolding using regularization from Eq. [7], and the second square bracket term denotes the variance of the full FOV reference image.

Estimating the Optimal Regularization Parameter Using the L-Curve

To determine the appropriate regularization parameter $\lambda^2$, the present invention utilizes the L-curve approach described in the literature proposed by Hansen, P. C. (1998, *Rank-deficient and discrete ill-posed problems: numerical aspects of linear inversion*). Qualitatively, it is expected that as regularization increases, more dependency on the prior information leads to a smaller discrepancy between the prior information and the solution at the cost of a larger difference between model prediction and observation. Similarly, a small regularization parameter decreases the difference between model prediction and observation at the cost of a larger discrepancy between the prior information and the solution. The L-2 norm is used to quantify the difference between these vectors. The model error and prior error can then be calculated using:

$$\rho \equiv \|\tilde{y} - \tilde{A}x^\rho\|_2 = \sum_{j=1}^{n}((1-f_j)u_j^H\tilde{y})^2 \quad [9]$$

$$\eta \equiv \|x^\rho - x^{\rho 0}\|_2 = \sum_{j=1}^{n}\left(f_j\left(\frac{u_j^H\tilde{y}}{s_{jj}} - x_j^{\rho 0}\right)\right)^2.$$

$\vec{x}^o_j$ is the j-th element of prior $\vec{x}^o$.

Figure 5:
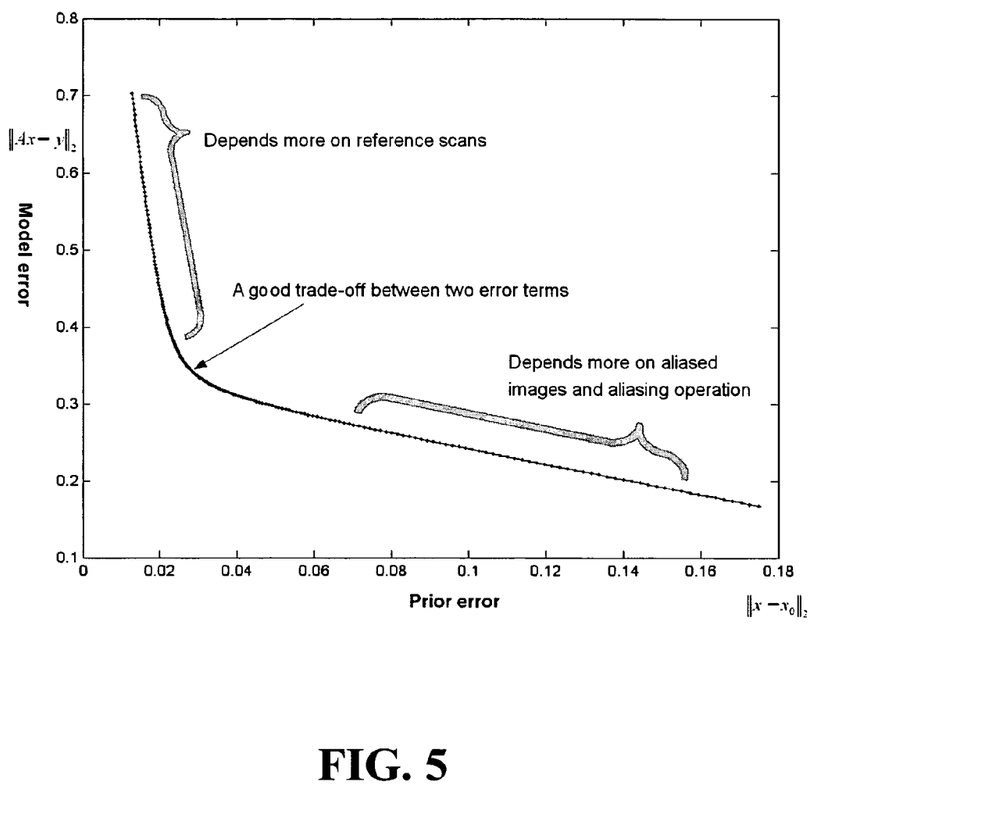
FIG. 5 is an L-curve diagram illustrating the model error and prior error during reconstruction the aliased images from an array.

Plotting model error versus prior error for a range of $\lambda^2$ shows the available tradeoffs between the two types of error. A representation of this plot, termed the L-curve, is shown in FIG. 5. The optimal regularization parameter is defined as that which strives to minimize and balance the two error terms. This occurs in the elbow of the L-curve. Mathematically this is where its curvature is at its minimum. The analytic formula for the L-curve's curvature enables a computationally efficient search for the $\lambda^2$ at the point of minimum curvature.

EXAMPLE

Experiments were performed on a 1.5T clinical MRI scanner (Siemens Medical Solutions, Inseln, N.J.) using a homemade 2-element array. Each element is a circular surface coil with a diameter of 5.5 cm tuned to the Larmor frequency of the scanner. The two element coils have a 1.5 cm overlap to minimize inductive coupling. The array was mounted on a curved plastic with a curvature radius of 20 cm to conform the phantom and subjects. A 2D gradient echo sequence was used to image the homogenous spherical (11.6 cm dia.) saline phantom. The imaging parameters are: TR=100 msec, TE=10 msec, flip angle=10 deg, slice thickness=3 mm, FOV=120 mm×120 mm, image matrix=256× 256. The same scan was repeated with the number of phase encode lines reduced to 75%, 62.5% and 50%.

The in vivo anatomical images were acquired using a 3T scanner (Siemens Medical Solution, Inseln, N.J.) with an 8-channel linear phased array coil wrapped around the whole brain circumferentially. Each circular surface coil element was of 9 cm in diameter and tuned to the proton Larmor frequency at 3T. Appropriate overlapping between neighboring coils minimized mutual inductance between coil elements. In experiments, a FLASH 3D sequence is used to acquire in vivo brain images from a healthy subject after approval from the Institutional Review Board and informed consent. Parameters of FLASH sequence are TR=500 msec, TE=3.9 msec, flip angle=20 deg, slice thickness=3 mm with 1.5 mm gap, 48 slices, FOV=210 mm×210 mm, image matrix=256×256. The same scan was repeated with the number of phase encode lines reduced to 50%, 37.5% and 25%.

The in vivo sensitivity reconstructions were employed for both phantom and in vivo experiments to avoid the potential increases in g-factor due to the mis-estimation of the coil sensitivity maps. Also to illustrate the validity of utilizing prior information without involving complications from different spatial resolutions, experiments employed identical spatial resolutions for both reference scans and accelerated acquisitions. While using a full resolution reference scan defeats the purpose of the SENSE acceleration for standard radiographic imaging, it is useful for time-series imaging applications such as fMRI. However, to demonstrate the effect of regularization when only a low-resolution full-FOV reference scan is available, experiments also apply the regularization method to a reconstruction using lower resolution full-FOV reference images. For this demonstration, the full-FOV reference images were downsampled by two or four fold (from 256×256 matrix to 128×128 and 64×64 matrix) and the lower resolution reference images were employed as priors in 2-fold and 2.67 fold accelerated acquisitions.

Use of regularization allows a smooth tradeoff between replication of the reference information and noise introduced in the poorly conditioned inversion that may result from a reliance on the measured data alone. It is important, therefore to have some indication that there is not an over reliance on the reference data (i.e. that the regularization parameter is not extremely high). For the fMRI application, the time series data should not simply replicate the reference data, in which case subtle temporal changes in the time-series will not be detected (functional CNR will be lowered).

To test the degree to which regularization might reduce the CNR in an fMRI study, experiments simulated a 2-fold accelerated SENSE fMRI scan consisting of 50 time points for the baseline (resting) condition and 50 time points for the active condition.

An image from the 8 channel array was used as a template to construct the 100 image series. Model activation was added to half of the images by increasing the pixel value by 10% in a 4 pixel ROI in the occipital lobe of the left hemisphere. White Gaussian noise of zero mean was added to the time-series and the images were reconstructed with and without the regularization method. A two-sample t-test between the active and baseline conditions was used to measure fMRI sensitivity.

In practice, the L-curve was calculated by iteratively calculating the two terms in the cost function (Eq. [9]) after performing SVD on the whitened encoding matrix. The search range of the regularization parameter was restricted in range to between the largest and smallest singular values. The search was done in a 200-sample geometric sequence, each term of which is given by a multiple of the previous one. The curvature associated with each sample was computed. Subsequently the minimum curvature was found within this search range. Image reconstruction, matrix regularization and computation of the g-factor maps were performed on a Pentium-III 1 GB dual processor Linux system with code written in MATLAB (Mathworks, Natick, Mass.).

Figure 6:
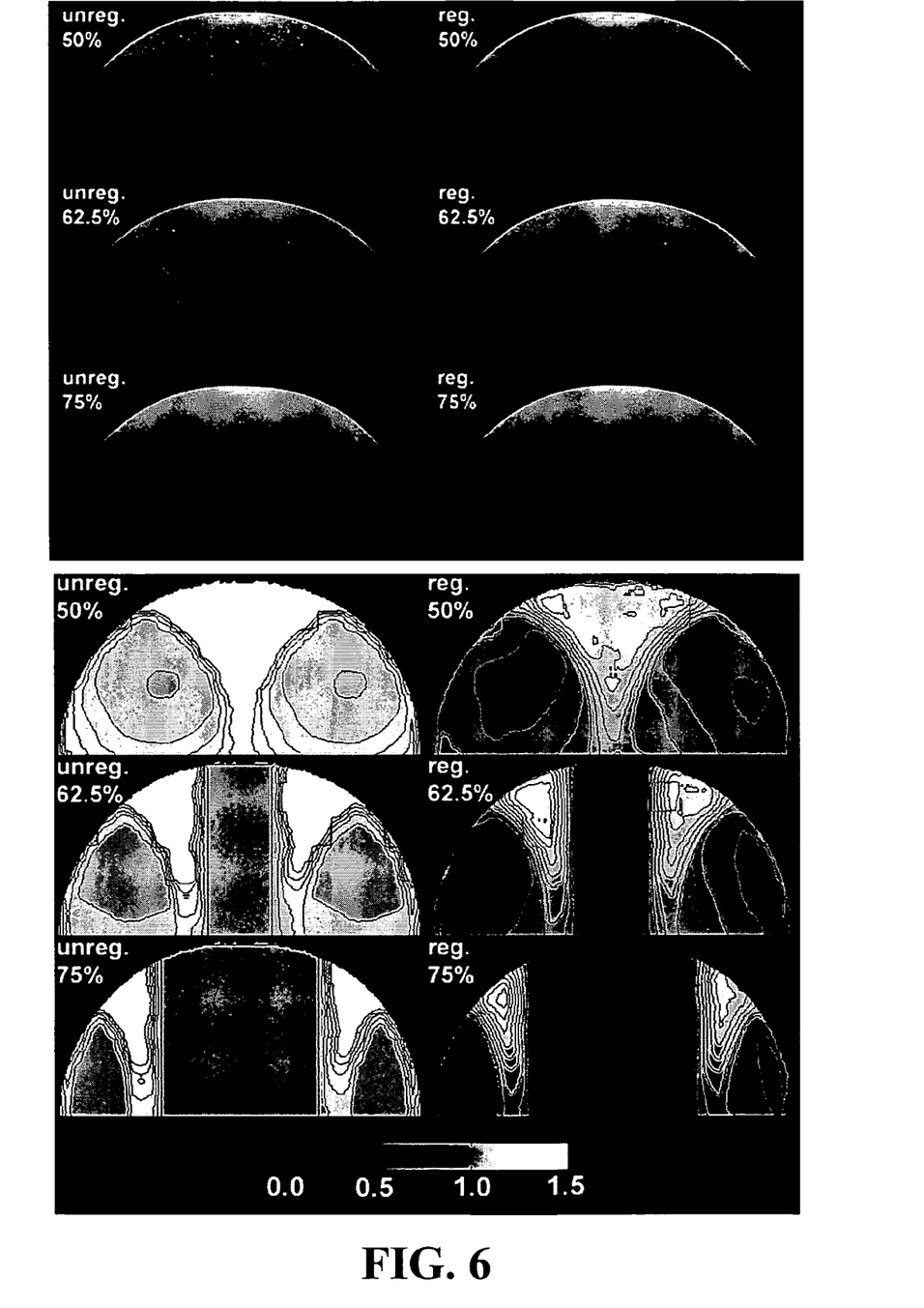
FIG. 6 is a diagram illustrating the reconstructed phantom images and g-factor maps using un-regularized or regularized reconstruction in 50%, 62.5% and 75% phase encoding.

FIG. 6 shows the reconstructed full-FOV phantom images and the associated g-factor maps from the 1.5T scanner using the spherical saline phantom and 2-element surface coil array using 1.33-fold (192 lines), 1.60-fold (160 lines), and 2.00-fold (128 lines) accelerations. Although the overall image SNR in this acquisition was relatively high near the surface coils, SENSE reconstruction noise arising from matrix inversion was significantly reduced by the regularization step for all of the accelerated acquisitions (1.33-fold, 1.60-fold and 2.00-fold accelerations). The effect of the regularization step was greatest for SENSE reconstruction at 2.00-fold acceleration. The largest reductions in noise were observed near the coil. The bottom panel of FIG. 6 shows the g-factor maps for regularized and non-regularized reconstructions. All the g-factor maps are scaled by the same factor to facilitate comparison. The regularized reconstructions allow g-factors less than one as prior information is used. In contrast, the conventional non-regularized reconstructions always have a minimum g-factor of one. TABLE 1 summarizes the g-factors averages, standard deviations, and the medians in 1.33-fold, 1.60-fold, and 2.00-fold accelerations. In the 1.33-fold acceleration case, the regularization provided an average of 87% reduction in the added reconstruction noise. In the 2.00-fold acceleration case, the regularization provided an average of 1.84 fold reduction.

TABLE 1

| | Unregularized | | | Regularized | | |
|---|---|---|---|---|---|---|
| acceleration | mean | std. | median | mean | std. | median |
| 2.00 | 1.47 | 1.56 | 1.17 | 0.80 | 0.52 | 0.67 |
| 1.60 | 1.43 | 1.96 | 1.07 | 0.76 | 0.65 | 0.60 |
| 1.33 | 1.31 | 1.27 | 1.00 | 0.70 | 0.58 | 0.50 |

Figure 7:
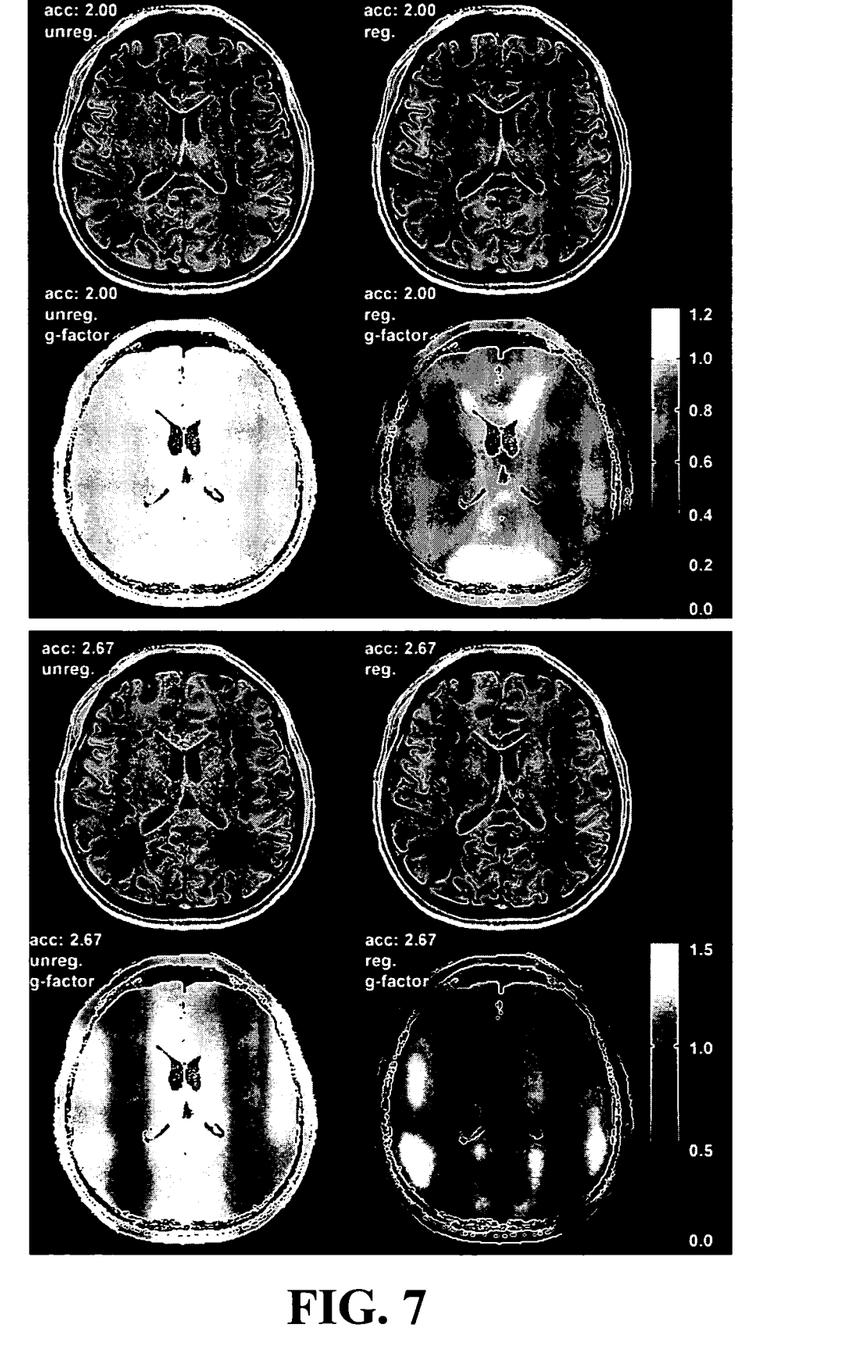
FIG. 7 is a diagram illustrating the reconstructed in vivo images and g-factor maps using un-regularized or regularized reconstruction in 37.5% (top panel) and 50% (bottom panel) phase encoding.
Figure 8:
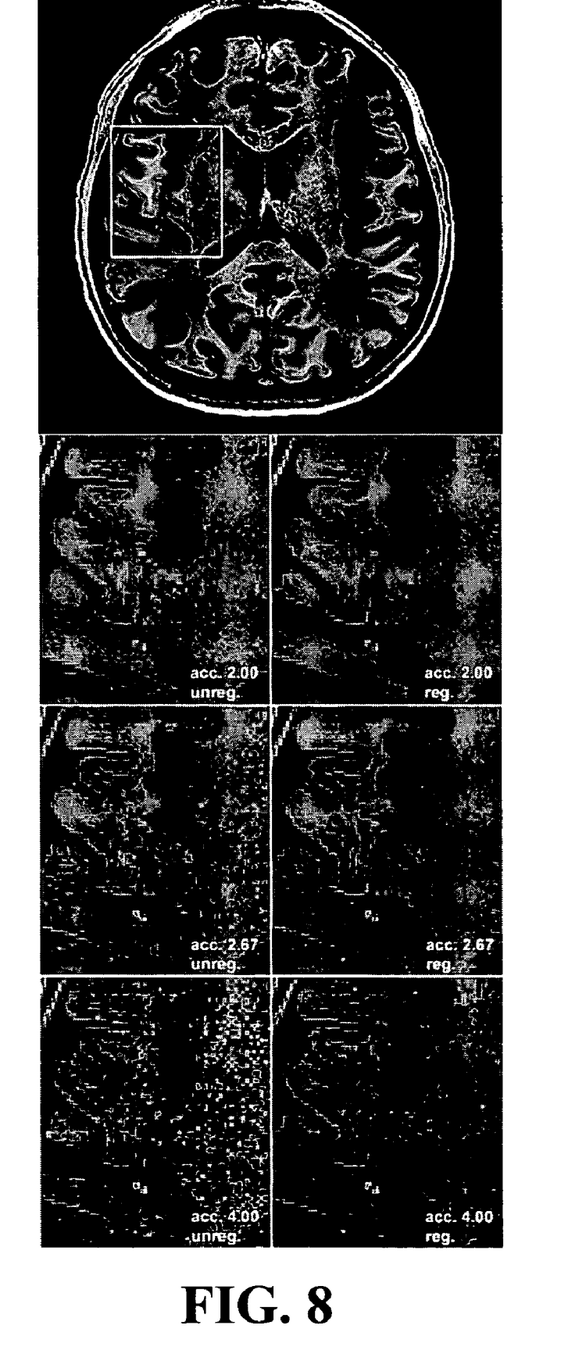
FIG. 8 is a diagram illustrating the selected temporal lobe area from the whole brain image as shown by the white box (top panel).

FIG. 7 shows the regularized and non-regularized reconstructed in vivo images and g-factor maps from the 3T scanner using the 8-channel array coil with 2.67-fold acceleration, and 2.00-fold acceleration. The g-factor maps showed noticeable local decreases in the added noise levels of the regularized reconstructed images. Similarly, regularization helped reduce noise in the temporal lobe in 2.67-fold acceleration (middle panel). In 4.00-fold acceleration, regularized reconstruction demonstrated decreased noise in the deep temporal lobe inside insular cortex. TABLE 2 summarizes the g-factor average, standard deviation, and median in the reconstructed anatomical images. As expected, more accelerated acquisitions resulted in higher g-factors in both regularized and non-regularized reconstructions. In 2.00-fold acceleration, g-factor average was suppressed from 1.07 to 0.72 by regularization (a 49% reduction). In 4.00-fold acceleration, g-factor associated noise reduction by regularization is 31% (non-regularized: 2.04, regularized: 1.52). Here, the advantages in SNR due to regularized reconstruction can be appreciated in the temporal lobe of the anatomical images (FIG. 8). In 2.00-fold acceleration, a banded noise region in the non-regularized reconstruction was minimized (FIGS. 7 and 8). The calculated L-curve is shown in FIG. 5 for a representative set of aliased pixels for the 2.0-fold accelerated case.

TABLE 2

| | Unregularized | | | Regularized | | |
|---|---|---|---|---|---|---|
| acceleration | mean | std. | median | mean | std. | median |
| 2.00 | 1.07 | 0.12 | 1.02 | 0.72 | 0.25 | 0.66 |
| 2.67 | 1.22 | 0.23 | 1.14 | 0.84 | 0.31 | 0.98 |
| 4.00 | 2.04 | 0.58 | 1.94 | 1.52 | 0.53 | 1.52 |

Figure 9:
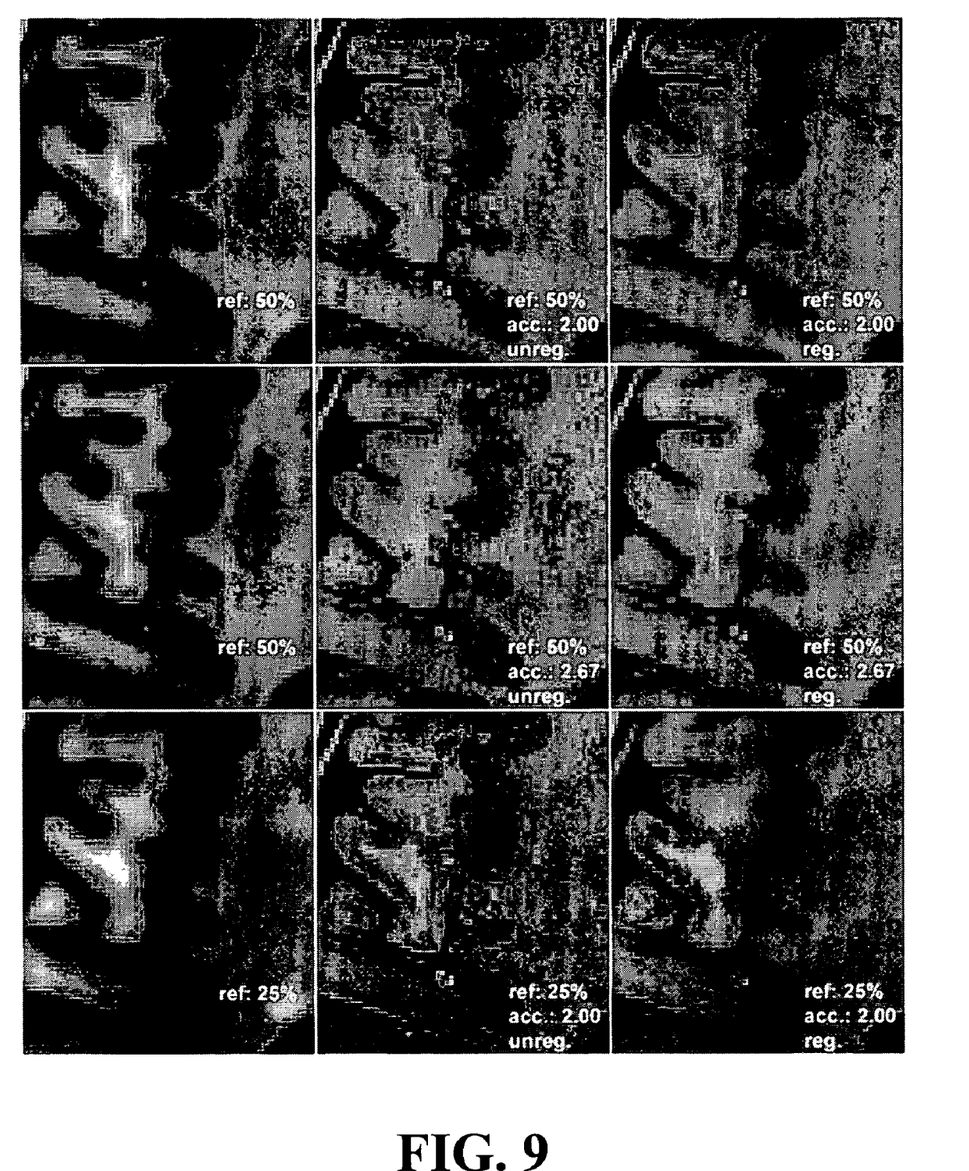
FIG. 9 is a diagram illustrating the detailed temporal lobe anatomy from unregularized and regularized SENSE reconstructions of 2.00 and 2.67 fold accelerations using reference scans at 50% and 25% spatial resolution of the accelerated acquisitions.

The SENSE reconstructions using lowered spatial resolution reference scans are shown in FIG. 9 and TABLE 3. In 2.00-fold acceleration using a reference scan at 50% of the spatial resolution of the accelerated acquisition, the average g-factor was reduced by the regularization method from 1.08 to 0.73. When employing the reference scan with 25% of the spatial resolution of the 2.00-fold accelerated acquisition, the average g-factor was reduced from 1.10 to 0.73. For the higher acceleration (2.67-fold) case, a reference scan of 50% of the spatial resolution resulted in an average g-factor of 1.21. Regularization reduced this to 0.86.

TABLE 3

| acceleration | Reference image resolution | Unregularized | | | Regularized | | |
|---|---|---|---|---|---|---|---|
| | | mean | std. | median | mean | std. | median |
| 2.00 | 100% | 1.07 | 0.12 | 1.02 | 0.72 | 0.25 | 0.66 |
| 2.00 | 50% | 1.08 | 0.15 | 1.02 | 0.73 | 0.26 | 0.66 |
| 2.00 | 25% | 1.10 | 0.20 | 1.01 | 0.73 | 0.27 | 0.67 |
| 2.67 | 100% | 1.22 | 0.23 | 1.14 | 0.84 | 0.31 | 0.98 |
| 2.67 | 50% | 1.21 | 0.23 | 1.14 | 0.86 | 0.31 | 1.01 |

In this simple fMRI model data, the contrast reduction resulting from replication of the reference image was compensated by the lower noise in the regularized reconstruction. A two-sample t-test between the active and baseline conditions showed that using regularization increased the t-statistics from 5.93 to 6.77.

For a full-FOV image with matrix size of 256×256, the computation time in estimating the regularization parameters are 72 min., 45 min. and 26 min. for 2.00-fold, 2.67-fold and 4.00-fold accelerations respectively. After the estimation of the regularization parameters, it takes 44 min, 34 min, and 24 min to reconstruct a single-slice single-measurement aliased image at 2.00-fold, 2.67-fold and 4.00-fold accelerations respectively, including calculating both regularized and non-regularized unfolded images and their associated g-factor maps.

In the experiments presented above, the regularization approach of the present invention worked robustly in different field strengths and array coil configurations and the benefits of reduced g-factor associated SNR loss were consistently observed. Once the regularization parameters are determined, the computational reconstruction time is identical to the reconstruction without regularization. Thus the additional computational demand for the proposed technique is the total time needed to estimate the regularization parameters. The long computational time required even for un-regularized inversion using MATLAB shows that this environment is useful only for testing the method. Note that the unfolding of aliased SENSE images includes calculation of both regularized and non-regularized reconstructions and their associated g-factor maps. The computation time can be reduced by ¼ if only one set of the unfolded full-FOV image is estimated. Computational speed may be further improved by optimizing code platform. Even given the closed form model errors and prior errors in Eq. [9], searching through different $\lambda^2$ is necessary to locate the minimum curvature. This could be made more efficient by using a direct regularization estimation method.

In dynamic imaging, the impact on the increased image reconstruction time due to regularization estimation can be minimized by estimating regularizations only once and then using identical regularization parameters for the repeated time points. This is particularly attractive for function brain activation studies where the changes with time are quite small. In addition to the proposed L-curve technique, other automatic regularization estimation methods, such as generalized cross validation (GCV), can be potentially used for appropriate regularization estimation.

The regularization approach of the present invention was proposed to minimize the SNR loss by constraining the matrix inversion. Mathematically, this is equivalent to obtaining a compromise between an expected a prioi result and the noisy result from inversion with no conditioning. Such an approach is equivalent to the maximal a posterori (MAP) estimation in stochastic Bayesian modeling. The "optimal" solution in this example thus implies the simultaneous minimizations of model errors and prior errors, which are graphically represented in the L-curve.

The proposed regularized parallel MRI reconstruction approach is expected to be universally workable independent of the k-space sampling scheme, the array coil configuration and the imaging anatomy. In the regularized SENSE reconstruction, it is found that g-factors can be smaller than 1. A g-factor of 1 indicates that the reconstruction added no additional noise due to the operation of unfolding the aliased image alone. A g-factor of less than 1, which can occur when regularization is employed, indicates that the unfolding operation itself decreases the stochastic variability of the estimated spin density compared to the full FOV reference scans. This reduction in noise results from the prior information used in the regularization process. From the original definition of g-factor, when excluding the effect of the number of samples (or the acceleration factor, R) in the denominator of the first term in Eq [4], the g-factor is the ratio of the variance of the estimated spin density from parallel acquisitions over the variance of the spin density from the full-FOV reference scan. As prior information is employed in the regularized parallel MRI reconstruction, less variability of the estimated spin density from parallel acquisitions is expected.

Thus, the use of regularization can partially compensate for the SNR loss due to the reduced samples in the accelerated acquisition. It is important to note that the reduction reflects the use of prior information, which may lead to a biased result. A potential concern of employing regularization is thus the replication of image features of the reference scan in the reconstructed image. This bias is seen as imparted image blurring in FIG. 9 for the high acceleration rate reconstruction using four fold lower spatial resolution reference images. In an fMRI time series experiment, later time-points might be biased toward the first reference image reducing the contrast between the activated and resting state. The model fMRI data set analyzed here suggests, however, that the CNR of the time series is improved by the regularization procedure. Thus, the contrast reduction is less important than the noise reduction due to regularization.

Another concern when using regularization in parallel MRI reconstruction is that the noise in the prior reference itself could at some point be introduced into the reconstruction, thereby limiting the visible SNR improvements. However, the quality of a full-FOV prior image can be improved either by multiple averages if parallel MRI is used for dynamic imaging applications, or by spatial smoothing using kernels with dimensions similar to the signal based on matched filter theory.

In contrast to fixed regularization strategies, the invention has utilized an automatic regularization implemented by mathematically and computationally convenient algorithms to stabilize the image reconstruction. This is expected to be more adaptive to different anatomy and coil configurations. Although the method was demonstrated using the in vivo SENSE method, the regularization method of the present invention for reduction of noise amplification might potentially benefit most variants of parallel MR reconstruction.

What is claimed is:

1. A method for generating a reconstructed magnetic resonance image of an object, said method comprising:
   acquiring full FOV images from multiple RF receivers to calculate noise covariances among multiple RF receivers and to calculate coil sensitivities for multiple RF receivers;
   acquiring sub-FOV images from multiple RF receivers;
   unfolding images for individual RF receivers given the noise covariances among RF receivers and the coil sensitivity of individual RF receivers; and
   combining unfolded images from individual RF receivers to generate FOV reconstructed magnetic resonance images;
   characterized in that said method further comprises:
   calculating full FOV reference images as prior information of the reconstruction image;
   estimating a given regularization parameter to constrain a solution image within a predetermined extent from the prior information; and
   obtaining the reconstructed magnetic resonance image using Tikhonov regularization with an optimal regularization parameter based on a compromise between the reconstruction using no conditioning and the reconstruction using complete conditioning by the replication of the prior information.

2. The method of claim 1, characterized in that said method further comprises:
   given the regularization parameter, calculating prior error for Tikhonov regularization, which is the deviation of the solution image from the prior information; and
   given the regularization parameter, calculating model error for Tikhonov regularization, which is the deviation of the collection of sub-FOV images from RF receivers from the modeled sub-FOV images from RF receivers;
   calculating different prior errors and model errors for the regularization parameter; and
   determining the optimal regularization parameter.

3. The method of claim 2, wherein the modeled sub-FOV images are derived from the solution of full-FOV image and the sub-sampling operation.

4. The method of claim 2, wherein said regularization parameter determines the relative weight with which two estimates of prior error and model error combine to form a cost function.

5. The method of claim 2, characterized in that said method further comprises:
   plotting model error versus prior error for a range of said regularization parameter to depict an L-curve.

6. The method of claim 5, characterized in that said method further comprises:
   determining the optimal regularization parameter that occurs in the elbow of the L-curve for minimizing and balancing the prior error and model error.

7. The method of claim 4, characterized in that said method further comprises:
   minimizing and balancing the model error versus the prior error in the cost function for determining the optimal regularization parameter.

8. A method for parallel imaging reconstruction in parallel MRI reconstruction, said method comprising:
   acquiring full FOV images from multiple RF receivers to calculate noise covariances among multiple RF receivers and to calculate coil sensitivities for multiple RF receivers;
   acquiring sub-FOV images from multiple RF receivers;
   unfolding images for individual RF receivers given the noise covariances among RF receivers and the coil sensitivity of individual RF receivers; and
   combining unfolded images from individual RF receivers to generate a reconstruction image;
   estimating a given regularization parameter to constrain a solution image within a predetermined extent from the prior information;
   determining the optimal regularization parameter using an L-curve approach; and
   obtaining the reconstructed magnetic resonance image using Tikhonov regularization with the optimal regularization parameter.

9. The method of claim 8, characterized in that said method further comprises:
   calculating prior error for Tikhonov regularization, which is the deviation of the solution image from the prior information; and
   calculating model error for Tikhonov regularization, which is the deviation of the collection of sub-FOV images from RF receivers from the modeled sub-FOV images from RF receivers.

10. The method of claim 9, wherein the modeled sub-FOV images are derived from the solution of full-FOV image and the sub-sampling operation.

11. The method of claim 9, wherein said regularization parameter determines the relative weight with which two estimates of prior error and model error combine to form a cost function.

12. The method of claim 9, characterized in that said method further comprises:
    plotting model error versus prior error for a range of said regularization parameter to depict the L-curve.

13. The method of claim 12, characterized in that said method further comprises:
    determining the optimal regularization parameter that occurs in the elbow of the L-curve for minimizing and balancing the prior error and model error.

14. The method of claim 11, characterized in that said method further comprises:
    minimizing and balancing the model error versus the prior error in the cost function for determining the optimal regularization parameter.

* * * * *